US008454928B2

(12) United States Patent
Dussarrat

(10) Patent No.: US 8,454,928 B2
(45) Date of Patent: Jun. 4, 2013

(54) TELLURIUM PRECURSORS FOR GST DEPOSITION

(75) Inventor: Christian Dussarrat, Wilmington, DE (US)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 500 days.

(21) Appl. No.: 12/212,350

(22) Filed: Sep. 17, 2008

(65) Prior Publication Data

US 2009/0074652 A1 Mar. 19, 2009

Related U.S. Application Data

(60) Provisional application No. 60/973,090, filed on Sep. 17, 2007.

(51) Int. Cl.
*C23C 16/30* (2006.01)
*B05D 5/12* (2006.01)
*C01B 19/00* (2006.01)

(52) U.S. Cl.
USPC ........... 423/508; 423/510; 438/610; 438/618; 427/124

(58) Field of Classification Search
USPC ......................................... 438/680; 423/508
IPC ...................................................... C23C 16/30
See application file for complete search history.

(56) References Cited

U.S. PATENT DOCUMENTS

| 4,377,613 | A | 3/1983 | Gordon |
| 4,419,386 | A | 12/1983 | Gordon |
| 5,656,338 | A | 8/1997 | Gordon |
| 6,984,591 | B1 * | 1/2006 | Buchanan et al. ............ 438/778 |
| 7,413,776 | B2 | 8/2008 | Shenai-Khatkhate et al. |
| 7,943,502 | B2 * | 5/2011 | Park et al. ...................... 438/597 |
| 2006/0035462 | A1 * | 2/2006 | Millward ....................... 438/681 |
| 2006/0046521 | A1 * | 3/2006 | Vaartstra et al. .............. 438/778 |
| 2006/0138393 | A1 | 6/2006 | Seo et al. |
| 2006/0172067 | A1 | 8/2006 | Ovshinsky et al. |
| 2006/0172068 | A1 | 8/2006 | Ovshinsky |
| 2006/0180811 | A1 | 8/2006 | Lee et al. |
| 2006/0292301 | A1 | 12/2006 | Herner |
| 2007/0054475 | A1 | 3/2007 | Lee et al. |
| 2008/0003359 | A1 * | 1/2008 | Gordon et al. ............ 427/248.1 |
| 2008/0026577 | A1 * | 1/2008 | Shenai-Khatkhate et al. ............................. 438/680 |
| 2008/0096386 | A1 | 4/2008 | Park et al. |
| 2008/0118636 | A1 | 5/2008 | Shin et al. |

FOREIGN PATENT DOCUMENTS

| DE | 42 34 998 | 4/1994 |
| EP | 0 568 074 | 11/1993 |
| EP | 1 180 553 | 2/2002 |
| EP | 1 464 724 | 10/2004 |
| EP | 1 464 725 | 10/2004 |
| EP | 1 806 427 | 7/2007 |
| EP | 1 995 236 | 11/2008 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 A1 | 5/2000 |
| WO | WO 01 66816 | 9/2001 |
| WO | WO 02 27063 | 4/2002 |
| WO | WO 03 083167 | 10/2003 |
| WO | WO 2007 062096 | 5/2007 |
| WO | WO 2007 067604 | 6/2007 |
| WO | WO 2007 133837 | 11/2007 |
| WO | WO 2008 002546 | 1/2008 |
| WO | WO 2008 008319 | 1/2008 |
| WO | WO 2008 057616 | 5/2008 |
| WO | WO 2009 039187 | 3/2009 |

OTHER PUBLICATIONS

International Search Report for PCT/US2008/076698.
Kim, et al. "Phase separation of a $Ge_2Sb_2Te_5$ alloy in the transition from an amorphous structure to crystalline structures." J. Vac. Sci. Technol. 929, 24(4), 2006.
Choi, et al. "Plasma-enhanced atomic layer deposition of $Ge_2Sb_2Te_5$ films using metal-organic sources for Phase change RAM." ALD 2006 proceedings, p. 62, 2006.
Wang, et al. "Influence of Sn doping upon the phase change characteristics of $Ge_2Sb_2Te_5$." Phys. Stat. Sol. (A) 3087-3095, 201(14), 2004.
Gonzalez-Hernandez, et al. "Structure of oxygen-doped Ge:Sb:Te films." Thin Solid Films (2006), 503(1-2), 13-17.
Gu et al. "Optical and structural properties of oxygen-doped and annealed Ge-Sb-Te- thin films." Chinese Journal of Lasers (2003), 30(12), 1110-1115.
Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.

(Continued)

*Primary Examiner* — Jun Li
(74) *Attorney, Agent, or Firm* — Patricia E. McQueeney

(57) ABSTRACT

A process for depositing a tellurium-containing film on a substrate is disclosed, including (a) providing a substrate in a reactor; (b) introducing into the reactor at least one tellurium-containing precursor having the formula $TeL_n$ or cyclic LTe $(-L-)_2TeL$, wherein at least one L contains a N bonded to one said Te, "n" is between 2-6, inclusive, and each "L," is independently selected from certain alkyl and aryl groups. The process further includes (c) optionally, introducing at least one M-containing source, wherein M is Si, Ge, Sb, Sn, Pb, Bi, In, Ag or Se, or a combination of any of those; (d) optionally, introducing a hydrogen-containing fluid; (e) optionally, introducing an oxygen-containing fluid; (f) optionally, introducing a nitrogen-containing fluid; (g) reacting the precursor(s) and M-containing source(s), if any, in the reactor with the hydrogen-, oxygen- and/or nitrogen-containing fluid, if any; and (h) depositing a tellurium-containing film onto the substrate.

22 Claims, No Drawings

OTHER PUBLICATIONS

Breunig, H.J. "Thermochromic molecules with bonds of Se or Te and Sb or Bi", Phosphorus and Sulfur, 1988, vol. 38, pp. 97-102.

Drake, J.E. et al. "Studies of silyl and germyl group 6 species. 5. Silyl and germyl derivatives of methane- and benzenetellurols," Inorg. Chem. 1980, 19, pp. 1879-1883.

King, R.B. "Secondary and tertiary phosphine adducts of germanium(II) iodide", Inorganic Chemistry, vol. 2, No. 1, Feb. 1963.

Nefedov O.M. et al., "Molecular complexes of germylene with n-donor ligands", Proceedings of the Academy of Sciences of the USSR Series Chemical, 1980, pp. 170-173, 1980.

Nefedov O.M. et al., "New adducted complexes of dichlorogermanium", Proceedings of the Academy of Sciences of the USSR Series Chemical, 1973, No. 12, pp. 2824-2825.

Pore, V. et al. "Atomic layer deposition of metal tellurides and selenides using alkylsilyl compounds of tellurium and selenium," J. Am. Chem. Soc., DOI 10.1021/ja8090388.

Razuvaev, G.A. et al. "Organosilicon and organogermanium derivatives with silicon-metal and germanium-metal bonds," http://media.iupac.org/publications/pac/1969/pdf/1903x0353.pdf.

Shcherbinin, V.V. et al. "Methods for preparing germanium dihalides," Russian J. of General Chem., vol. 68, No. 7, 1998, pp. 1013-1016.

Written Opinion for PCT/US2008/076698 / U.S. Appl. No. 12/212,350.

International Search Report and Written Opinion for PCT/IB2008/055499 / U.S. Appl. No. 12/341,685.

Glatz, F. et al. "Thermal CVD of amorphous germanium films from 2,5-bis(tert.-butyl)-2,5-diaza-1-germa-cyclopentane organometallic precursor". Mat. Res. Soc. Symp. Proc.,1994, vol. 336, pp. 541-545.

Herrmann, W.A. et al. "Stable cyclic germanediyls ("cyclogermylenes"); Synthesis, structure, metal complexes, and thermolyses", Angew. Chem. Int. Ed. Engl., (1992) 31, No. 11, pp. 1485-1488.

Lappert, M.F. et al. "Monomeric, coloured germanium(II) and tin(II) di-t-butylamides, and the crystal and molecular structure of $Ge(NCMe_2[CH_2]_3CMe_2)_2$". J. Chemical Soc. Chem. Comm. 1980, pp. 621-622.

Prokop, J. et al. "Selective deposition of amorphous germanium on Si with respect to $SiO_2$ by organometallic CVD". J. NonCryst. Solids, 198-200 (1996) pp. 1026-1028.

Kim, R.-Y. et al. "Structural properties of $Ge_2Sb_2Te_5$ thin films by metal organic chemical vapor deposition for phase change memory applications". Appl. Phys. Lett., 89, 102107-1-102107-3, 2006.

Lee, J. et al. "GeSbTe deposition for the PRAM application". Appl. Surf. Sci., 253, pp. 3969-3976, 2007.

Choi, B.J. et al., "Cyclic PECVD of $Ge_2Sb_2Te_5$ films using metallorganic sources". J. Electrochemical Soc., 154 (4), pp. H318-H324, 2007.

* cited by examiner

TELLURIUM PRECURSORS FOR GST DEPOSITION

CROSS-REFERENCE TO RELATED APPLICATIONS

The present application claims the benefit of U.S. Provisional Application No. 60/973,090 filed Sep. 17, 2007, the disclosure of which is hereby incorporated herein by reference.

FIELD OF THE INVENTION

This invention relates generally to the field of semiconductor fabrication, and more specifically to phase change materials used in the fabrication of nonvolatile memory devices. Still more particularly, the invention relates to tellurium precursor compounds for forming germanium antimony telluride (GST) films on a substrate.

BACKGROUND

Phase change materials are used in standard bulk silicon technologies to form the memory elements of nonvolatile memory devices. Phase change materials exhibit at least two different states, one being amorphous and the other(s) crystalline. The amorphous state is characterized by the absence of crystallinity or the lack of long range order, as opposed to crystallized states, which are characterized by a long range order. Accordingly, the order in a unit cell, which is repeated a large number of times, is representative of the whole material.

Each memory cell in a nonvolatile memory device may be considered as a variable resistor that reversibly changes between higher and lower resistivity states corresponding to the amorphous state and the crystalline state of the phase change material. The states can be identified because each state can be characterized by a conductivity difference of several orders of magnitude. In these devices, the phase changes of the memory element are performed by direct heating of the phase change material with high programming currents. Conventionally, bipolar transistors are used to deliver high programming currents by directly heating the phase change material. The high current produces direct heating of the phase change material, which can cause the phase change material to degrade over repeated programming operations, thereby reducing memory device performance.

Among the materials of practical use today, most contain tellurium. Of those materials, the most extensively studied material is $Ge_2Sb_2Te_5$. While the deposition can be conventionally performed by plasma vapor deposition (PVD) techniques such as sputtering, chemical vapor deposition (CVD) and atomic layer deposition (ALD) and related techniques including pulse-CVD, remote plasma CVD, plasma assisted CVD, plasma enhanced ALD), a variety of materials are now being studied in order to overcome the challenges of deposition in complex structures, including those consisting of trenches. The use of $Ge(tBu)_4$, $Sb(iPr)_3$ and $Te(iPr)_2$ has been reported, for instance. The use of such molecules for the deposition of germanium-antimony-tellurium (GST) material raises some difficulties, however. For example, tellurium alkyl or aryls compounds (e.g., $Te(iPr)_2$), are insufficiently thermally stable for a reproducible process. Although there have been significant advancements in the art, there is continuing interest in the design and use of precursor compounds with improved stability.

SUMMARY

A process using certain tellurium precursor compounds for forming tellurium-containing thin films (e.g., germanium antimony telluride films), and the resulting film-coated substrate are disclosed. Some of the precursor compounds with improved stability potentially lead to an industrially scalable process for manufacture of nonvolatile memory devices.

In accordance with certain embodiments of the invention, a process is provided for depositing a tellurium-containing film on a substrate. The process comprises: (a) providing a substrate in a reactor configured for chemical vapor deposition or for atomic layer deposition; (b) introducing into the reactor at least one tellurium-containing precursor having the formula $TeL_n$ or cyclic $LTe(-L-)_2TeL$, wherein at least one L contains a N bonded to one said Te, "n" is between 2-6, inclusive, and each "L," is independently selected from the alkyl and aryl groups consisting of: amides of the form —$NR^1R^2$ wherein $R^1$, $R^2$ represents H, an alkyl group, or a silyl group; cyclic amides of the form —NR wherein R represents a $C_1$-$C_6$ linear, branched, cyclic, or silyl group; imido groups of the form =NR wherein R represents a $C_1$-$C_6$ linear, branched, cyclic, or silyl group; a group of the form —N(R)—, wherein the —N(R)— bridges 2 telluriums; diamides of the form —$NR^1$-A-$R^2N$— wherein $R^1$, $R^2$ and A, are, independently, a $C_1$-$C_6$ linear, branched, cyclic, or silyl group; aminoamide groups of the form —$NR^1$-A-$NR^2R^3$ wherein $R^1$, $R^2$, $R^3$ and A are, independently, a $C_1$-$C_6$ linear, branched, cyclic, or silyl group; alkoxyamide groups of the form —$NR^1$-A-$OR^2$ wherein $R^1$, $R^2$ and A are, independently, a $C_1$-$C_6$ linear, branched, cyclic, or silyl group; amidinate groups of the form —$NR^1$—$C(R^2)$—$NR^3$ wherein $R^1$, $R^2$, $R^3$ are, independently, a $C_1$-$C_6$ linear, branched, cyclic, or silyl group; and guanidinate groups of the form —$NR^1$—$C(NR^2R^3)$—$NR^4$ wherein $R^1$, $R^2$, $R^3$, $R^4$ are, independently, a $C_1$-$C_6$ linear, branched, cyclic, or silyl group. In some embodiments, "n" is 2 or 4.

In some embodiments, the process further includes (c), optionally, introducing at least one M-containing source, wherein M is Si, Ge, Sb, Sn, Pb, Bi, In, Ag or Se, or a combination of any of those, into the reactor. In some embodiments, the process further includes (d), optionally, introducing a hydrogen-containing fluid into the reactor. In some embodiments, the process further includes (e), optionally, introducing an oxygen-containing fluid into the reactor. In some embodiments, the process further includes (f), optionally, introducing a nitrogen-containing fluid into the reactor. The process includes (g), reacting the precursor(s) and M-containing source(s), if any, in the reactor with the hydrogen-, oxygen- and/or nitrogen-containing fluid, if any, and (h), depositing a tellurium-containing film onto the substrate.

In some embodiments, in step (h), depositing is carried out at a temperature between 200° C. and 600° C. In some embodiments, the depositing is carried out at a temperature between 350° C. and 550° C. In some embodiments, in step (h), depositing is carried out at a pressure between 1 Pa and 100000 Pa.

In some embodiments, at least one of the tellurium-containing precursors has a melting point below 100° C., and in some cases is below 50° C. In some embodiments, at least one of the tellurium-containing precursors is liquid at room temperature.

In some embodiments, in step (b), at least two of the above-identified tellurium-containing precursors are mixed together to provide a precursor mixture which is then introduced into the reactor.

In some embodiments, step (c) comprises introducing into the reactor at least one germanium source selected from the group consisting of trigermylamine, germane, digermane, and aminogermane compounds of the formula $GeR_x(NR^1R^2)_{4-x}$, wherein x is between 0 and 4, inclusive, and R, $R^1$ and $R^2$ are independently H or a linear, branched or cyclic $C_1$-$C_6$ carbon chain. In some embodiments, the germanium source is 4DMAG, $Ge(NMe_2)_4$, 3DMAG, $GeH(NMe_2)_3$, BDEAG, or $GeH_2(NEt_2)_2$), or a mixture of any of those.

In some embodiments, step (c) comprises introducing into the reactor at least one antimony source selected from the group consisting of trimethylantimony, dimethylantimony hydride, $SbCl_3$, $SbCl_5$, and amidoantimony compounds of the formula $SbR_x(NR^1R^2)_{3-x}$ wherein x is between 0 and 3, inclusive, and $R^1$ and $R^2$ are independently H or a linear, branched or cyclic $C_1$-$C_6$ carbon chain, and mixtures of any of those.

In some embodiments, step (c) comprises introducing into the reactor at least one bismuth source selected from the group consisting of $BiCl_3$, $Bi(NMe_2)_3$, $Bi(NEt_2)_3$, $Bi(NEt_2)_3$, and $Bi(=NR^1)(NR^2R^3)_3$, wherein each $R^1$, $R^2$ and $R^3$ are independently H or a linear, branched or cyclic $C_1$-$C_6$ carbon chain, and mixtures of any of those. In some embodiments, the amino ligand may have different substituents.

In some embodiments, step (c) comprises introducing into the reactor at least one tin source selected from the group consisting of stannane, $SnCl_4$ and aminogermane compounds of the formula $SnR_x(NR^1R^2)_{4-x}$ wherein x is between 0 and 4, inclusive, and R, $R^1$ and $R^2$ are independently H or a linear, branched or cyclic $C_1$-$C_6$ carbon chain. In some embodiments, the tin source is 4DMASn, $Sn(NMe_2)_4$, 3DMASn, or $SnH(NMe_2)_3$, or a combination of any of those.

In some embodiments, step (c) comprises introducing into the reactor at least one silicon source selected from the group consisting of trisilylamine, silane, disilane, trisilane, aminosilane compounds of the formula $SiR_x(NR^1R^2)_{4-x}$ wherein x is between 0 and 4, inclusive, and R, $R^1$ and $R^2$ are independently H or a linear, branched or cyclic $C_1$-$C_6$ carbon chain. In some embodiments, at least one such silicon source is 4DMAS, $Si(NMe_2)_4$, 3DMAS, $SiH(NMe_2)_3$, BDEAS, $SiH_2(NEt_2)_2$, or a combination of any of those.

In some embodiments, in (d), the hydrogen-containing fluid is $H_2$, $NH_3$, hydrazine or an alkyl or aryl derivative of hydrazine, or a $H^+$, $NH^+$, or $NH_2^+$ radical, or a mixture of any of those. In some embodiments, in (f), the nitrogen-containing fluid comprises $N_2$, $NH_3$, hydrazine or an alkyl or aryl derivative of hydrazine, or a $N^+$, $NH^+$ or $NH_2^+$ radical, or a mixture of any of those.

In some embodiments, the reactor is configured for chemical vapor deposition and steps (b) and (c)-(f) are performed simultaneously. In some embodiments, the reactor is configured for atomic layer deposition and steps (b) and (c)-(f) are performed sequentially. In some embodiments, steps (b) and (c) are performed together in one pulse and step (d) is performed in a separate pulse, for modified atomic layer deposition. In some embodiments, in (d), hydrogen gas is continuously introduced and, in steps (b) and/or (d), the tellurium and/or M-containing source is/are introduced by pulsing, for pulsed chemical vapor deposition.

In accordance with still another embodiment of the invention, a tellurium-containing thin film-coated substrate is provided which is the product of an above-described process. The foregoing has outlined rather broadly certain features and technical advantages of some embodiments of the present invention in order that the detailed description of the invention that follows may be better understood. These and additional embodiments, features and potential advantages will be apparent in the following detailed description.

DETAILED DESCRIPTION

Definitions

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ".

As used herein, the abbreviation "Me" refers to a methyl group, "Et" refers to an ethyl group; "Pr" refers to a propyl group, "iPr" refers to an isopropyl group, "Bu" refers to a butyl group, and "tBu" refers to a tertiary butyl group.

As used herein, the abbreviation "4DMAG" refers to tetrakis(dimethylamino)germane, which is also known as Ge(NMe2)4; the abbreviation "3DMAG" refers to tris(dimethylamino)germane, which is also known as GeH(NMe2)3; "BDEAG" refers to bis(diethylamino)germane, which is also known as GeH2(Net2)2; "4DMASn" refers to tetrakis(dimethylamino)tin, which is also known as Sn(NMe2)4; "3DMASn" refers to tris(dimethylamino)tin, which is also known as SnH(NMe2)3; "4DMAS" refers to tetrakis(dimethylamino)silane, which is also known as Si(NMe2)4; "3DMAS" refers to tris(dimethylamino)silane, which is also known as SiH(NMe2)3; and BDEAS refers to bis(diethylamino)silane, which is also known as SiH2(NEt2)2.

Tellurium Precursors

Certain tellurium compounds (precursors) are disclosed herein in which at least one ligand contains a nitrogen bonded to tellurium. These compounds are potentially useful precursors in chemical vapor deposition (CVD), pulsed-CVD and atomic layer deposition (ALD) regimes for semiconductor fabrication applications, such as for preparing a phase change layer in a phase change memory device (e.g., RAM manufacture).

These compounds contain at least one Te—N bond, either single, double or triple, in order to allow chemisorption on the wafer surface, and to perform atomic layer deposition or chemical vapor deposition of the compound. The compounds are of the general formula $TeL_n$ or have a cyclic structure defined by the general formula cyclic $LTe(-L-)_2TeL$. In either structural form, at least one of the L components contains a N bonded to Te. Each "L" is, independently, either an alkyl or an aryl molecule. The number of ligands ("L") is between 1 and 6, inclusive. In some embodiments, the preferred number of ligands is 2. In some embodiments, L is an amide of the form —$NR^1R^2$ wherein $R^1$, $R^2$ are, independently, H, an alkyl group, or a silyl group (e.g., the trimethylsilyl group). In some embodiments, L is a cyclic amide of the form —NR wherein R represents a $C_1$-$C_6$ linear, branched or cyclic group, or a silyl group. In some embodiments, L is an imido of the form =NR wherein R represents $C_1$-$C_6$ either linear, branched or cyclic, or a silyl group. In some embodiments, L is a group of the form —N(R)— bridging 2 telluriums. In some embodiments, L is a diamide of the form —$NR^1$-A-$R^2N$— wherein $R^1$, $R^2$ and A are, independently, a $C_1$-$C_6$ linear, branched, cyclic or silyl group. In some embodiments, L is an aminoamide group —$NR^1$-A-$NR^2R^3$ where $R^1$, $R^2$, $R^3$ and A are a $C_1$-$C_6$ linear, branched, cyclic or silyl group. In some embodiments, L is an alkoxyamide group —$NR^1$-A-$OR^2$ wherein $R^1$, $R^2$ and A are, independently, a $C_1$-$C_6$ linear, branched, cyclic or silyl group. In some embodiments, L is an amidinate group —NR$^1$—C(R$^2$)—NR$^3$ wherein R$^1$, R$^2$, R$^3$ are, independently, a C$_1$-C$_6$ linear, branched, cyclic or silyl group. In some embodiments, L is a guanidinate group described by the formula —NR$^1$—C(NR$^2$R$^3$)—NR$^4$ wherein R$^1$, R$^2$, R$^3$, R$^4$ are, independently, a C$_1$-C$_6$ linear, branched, cyclic, or silyl group.

Some exemplary tellurium precursor compounds having one of the above-described general formulae (I and II) are Te(NMe$_2$)$_2$, Te(NEt$_2$)$_2$, TeMe(NMe$_2$), TeMe(NEt$_2$), TeMe(NiPr$_2$), Me$_2$Te=NtBu, the cyclic Me$_2$Te(—NtBu-)$_2$TeMe$_2$, tellurium amidinates such as Te(NiPr-CiPr—NiPr)$_2$, MeTe(NiPr-CiPr—NiPr), tellurium guanidinates such as Te(NiPr—C(—NMe$_2$)—NiPr)$_2$, MeTe(NiPr—C(—NMe$_2$)—NiPr), tellurium aminoamides such as Te(MeN—CH$_2$—CH$_2$—NMe$_2$), TeMe(MeN—CH$_2$—CH$_2$—NMe$_2$), Te(EtN—CH$_2$—CH$_2$—NMe$_2$), TeMe(EtN—CH$_2$—CH$_2$—NMe$_2$), Te(MeN—CMe$_2$—CH$_2$—NMe$_2$), TeMe(MeN—CMe$_2$—CH$_2$—NMe$_2$), tellurium alkoxyamides Te(MeN—CH$_2$—CH$_2$—OMe), TeMe(MeN—CH$_2$—CH$_2$—OMe), and the cyclic (tBuN=)Te(—NtBu-)$_2$Te(=NtBu) and (iPrN=)Te(—NiPr—)$_2$Te(=NiPr).

In some embodiments, an above-described amino based tellurium precursor is suitable for the deposition of Te-containing thin films by either ALD or metal-organic chemical vapor deposition (MOCVD) processes. Various embodiments of the Te precursors are liquid at room temperature or have a melting point lower than 50° C. Some of the above-described Te—N compounds are sufficiently thermally stable to enable proper distribution (e.g., gas phase or direct liquid injection) without particles generation. Some of the above-described Te—N compounds are sufficiently thermally stable to allow a wide self-limited ALD window, permitting deposition of a variety of tellurium-containing films, including materials containing four or more elements, by using one or a combination of co-reactants. Some exemplary co-reactants are H$_2$, NH$_3$, H$_2$O, SiH$_4$, Si$_2$H$_6$, Si$_3$H$_8$, TriDMAS, BDMAS, BDEAS, TDEAS, TDMAS, TEMAS, (SiH$_3$)$_3$N, and (SiH$_3$)$_2$O. The above-described Te precursors may be advantageously used to prepare pure tellurium thin films or tellurium-containing alloy films on silicon substrates.

Forming a Tellurium Thin Film

An exemplary process for depositing a pure tellurium thin film onto a substrate (e.g., a standard silicon wafer) includes the following steps:
(a) providing a substrate in a reaction chamber (reactor), such as a conventional CVD or ALD reactor.
(b) introducing into the reactor at least one tellurium-containing precursor having the formula TeL$_n$ or the cyclic LTe(-L-)$_2$TeL, as described above, wherein n is between 2-6, inclusive. In some embodiments, n is 2 or 4. Each ligand, "L," is defined independently, as described above with respect to the precursor compounds, and at least one L contains a N bonded to Te. At least one introduced tellurium-containing precursor has a melting point below 100° C. In some embodiments, the melting point is below 50° C., and in some embodiments, the tellurium precursor is liquid at room temperature. In some embodiments, at least two different tellurium-containing precursors (formula I and/or formula II) are mixed together to provide a precursor mixture, which is then introduced into the reactor.
(c) introducing a hydrogen source (reductant) into the reactor. Suitable reductant fluids include, but are not limited to, H$_2$, NH$_3$, hydrazine and its alkyl or aryl derivatives, hydrogen-containing radicals such as H$^+$, NH$^+$ or NH$_2{}^+$, and mixtures of any of those.
(d) reacting the tellurium-containing precursor(s) in the reactor with the hydrogen source.
(e) depositing a tellurium film onto the substrate at a temperature between 200° C. and 600° C. In some applications, the deposition temperature is between 350° C. and 550° C.
(f) during the film deposition process, the pressure is maintained between 1 Pa and 100 000 Pa. In some applications, the pressure is between 25 Pa and 1000 Pa.

Tellurium Alloy Thin Films

The thermal instability of tellurium alkyls makes difficult the establishment of a stable process for the deposition of tellurium-containing alloy films (e.g., germanium-antimony-tellurium (GST) films) on a substrate such as a silicon wafer. In order to reduce the transition temperature to reversibly change the state from amorphous to crystalline, the size of the grains in the crystalline state needs to be minimized to ensure an easier phase transition. Doping of GST materials with certain elements favors the reduced size of the grains, for example, using oxygen, nitrogen, tin, silicon, or carbon. Accordingly, some exemplary tellurium alloy films have the formula

$$Ge_aSb_bTe_cO_dN_eM_f,$$

wherein 0≦a<3; 0≦b≦3; 0<c≦8; 0≦d<1; 0≦e<1; and 0≦f<1. In some embodiments, 1.5≦a≦2.5. In some embodiments, 1.5≦b≦2.5. In some embodiments, 4≦c≦6. In some embodiments, 0.1≦d≦0.5. In some embodiments, 0.1≦e≦0.5. In some embodiments, 0.3≦f≦0.8. "M" is an optional metal or semi-metal element selected from the group consisting of M is Si, Ge, Sn, Pb, Bi, In, Ag or Se, or is a combination of any of those. "O" is an optional oxygen. "N" is an optional nitrogen. In some embodiments a GST film has the formula Ge$_2$Sb$_2$Te$_5$.

Forming a Tellurium Alloy Thin Film

An exemplary process for depositing a GST or other tellurium alloy thin film onto a substrate (e.g., a standard silicon wafer) generally includes the following steps:
(a) providing a substrate in a reaction chamber (reactor), such as a conventional CVD or ALD reactor.
(b) introducing into the reactor at least one tellurium-containing precursor having the formula TeL$_n$ or the cyclic LTe(-L-)$_2$TeL, as described above, wherein n is between 2-6, inclusive. In some embodiments, n is 2 or 4. Each ligand, "L," is defined independently, as described above with respect to the precursor compounds, and at least one L contains a N bonded to Te. At least one introduced tellurium-containing precursor has a melting point below 100° C. In some embodiments, the melting point is below 50° C., and in some embodiments, the tellurium-containing precursor is liquid at room temperature. In some applications, at least two different tellurium-containing precursors (formula I and/or formula II) are mixed together to provide a precursor mixture, which is then introduced into the reactor.
(c) optionally, introducing at least one M-containing precursor, wherein M is Si, Ge, Sb, Sn, Pb, Bi, In, Ag or Se, or a combination of any of those. For example, some suitable M-containing precursors are:
(1) a germanium source such as trigermylamine, germane, digermane, or an aminogermane of the formula $GeR_x(NR^1R^2)_{4-x}$ (wherein x is between 0 and 4; R, $R^1$ and $R^2$ are independently H or a linear, branched or cyclic $C_1$-$C_6$ carbon chain. In some instances, the germanium source is 4DMAG, $Si(NMe_2)_4$, 3DMAG, $SiH(NMe_2)_3$, or BDEAG $GeH_2(NEt_2)_2$), or a mixture of any of those;

(2) an antimony source such as trimethylantimony, dimethylantimony hydride, $SbCl_3$, $SbCl_5$, or an amidoantimony compound of the formula $SbRi_x(NR^1R^2)_{3-x}$ (where x is comprised between 0 and 3; $R^1$ and $R^2$ are independently H or a linear, branched or cyclic $C_1$-$C_6$ carbon chain, and mixtures thereof;

(3) a bismuth source such as $BiCl_3$, $Bi(NMe_2)_3$, $Bi(NEt_2)_3$, $Bi(NEt_2)_3$, or $Bi(=NR^1)(NR^2R^3)_3$, wherein each $R^1$, $R^2$ and $R^3$ are independently H or a linear, branched or cyclic $C_1$-$C_6$ carbon chain, and wherein the amino ligand may have different substituents, and mixtures thereof;

(4) a tin source such as stannane, $SnCl_4$, or an aminostannane compound of the formula $SnR_x(NR^1R^2)_{4-x}$ (where x is comprised between 0 and 4; R, $R^1$ and $R^2$ are independently H or a linear, branched or cyclic $C_1$-$C_6$ carbon chain. Nonlimiting examples of suitable tin sources are 4DMASn, $Sn(NMe_2)_4$, 3DMASn, $SnH(NMe_2)_3$, and mixtures thereof; and (5) a silicon source such as trisilylamine, silane, disilane, trisilane, or an aminosilane compound of the formula $SiR_x(NR^1R^2)_{4-x}$ (where x is between 0 and 4; R, $R^1$ and $R^2$ are independently H or a $C_1$-$C_6$ carbon chain, either linear, branched or cyclic. Nonlimiting examples of suitable silicon sources are 4DMAS, $Si(NMe_2)_4$, 3DMAS, $SiH(NMe_2)_3$, BDEAS, $SiH_2(NEt_2)_2$, and mixtures thereof.

(d) optionally, introducing a hydrogen-containing (i.e., reductant), oxygen-containing, or nitrogen containing fluid, or a combination of any of those, into the reactor. Suitable reductant fluids include, but are not limited to, $H_2$, $NH_3$, hydrazine and its alkyl or aryl derivatives, hydrogen-containing radicals such as $H^+$, $NH^+$ or $NH_2^+$, and mixtures of any of those. Suitable nitrogen-containing fluids include, but are not limited to, $N_2$, $NH_3$, hydrazine and its alkyl or aryl derivatives, nitrogen-containing radicals such as $N^+$, $NH^+$, $NH_2^+$, and mixtures of any of those.

(e) reacting the precursor(s) in the reactor with the hydrogen-, oxygen- and/or nitrogen-containing fluid, if any.

(f) depositing a tellurium-containing film onto the substrate at a temperature between 200° C. and 600° C. In some applications, the deposition temperature is between 350° C. and 550° C.

(g) during the film deposition process, the pressure is maintained between 1 Pa and 100000 Pa. In some applications, the pressure is between 25 Pa and 1000 Pa.

The various reactants may be introduced into the reactor either simultaneously (chemical vapor deposition), sequentially (atomic layer deposition), or in any other suitable combination. For example, the two metal sources may be introduced together in one pulse and the hydrogen-containing gas introduced in a separate pulse, for modified atomic layer deposition. As another example, hydrogen may be continuously introduced and a metal source introduced by pulsing, for pulsed chemical vapor deposition.

Example 1

Deposition of a Pure Tellurium Film

To make the deposition of a pure tellurium film on the surface of a wafer, a Te—N source is vaporized as defined in step (b), above, in the reactor, and a hydrogen source (e.g., hydrogen or ammonia) is injected into the reactor, where the reactants are reacted at a temperature between 150° C. and 350° C. and at a pressure between 25 Pa and 1000 Pa, for the duration necessary to achieve either a thin film deposition on the substrate or to fill out trenches by ALD, PEALD or a pulse CVD process. In the pulse CVD process, sequential pulse injection of metal sources are necessary in order to allow regular deposition of the tellurium.

Example 2

Deposition of $Ge_2Sb_2Te_5$ Alloy

Metallic tellurium-containing films are deposited onto a support such as a conventional silicon wafer in a reactor using ALD, CVD, MOCVD, pulse CVD processes. The procedure described above for forming a tellurium alloy thin film, and the conditions described in Example 1 are used in this example. A suitable germanium source is injected into the reactor. Some exemplary germanium sources are $GeCl_4$, $Ge(NMe_2)_4$ and $GeH_2(NEt_2)_2$. A suitable antimony source is also injected into the reactor. Some exemplary antimony sources are $SbCl_3$, $SbCl_5$, $Sb(NMe_2)_3$ and $SbMe_2(NMe)$. A suitable hydrogen source is introduced into the reactor. As described hereinabove, some exemplary hydrogen sources are hydrogen, hydrogen radicals and ammonia. Two M-containing precursors, in addition to the tellurium, germanium and antimony precursor(s) are also introduced into the reactor to provide the M source of metal.

To deposit the alloy film on the surface of a wafer or in a trench to manufacture memory structures for PRAM, the metal sources are vaporized as defined in step (b), above, into the reactor. These reactants react at a suitable temperature between 150° C. and 350° C., and at a pressure between 25 Pa and 1000 Pa, for a suitable period of time sufficient to achieve either a thin film deposition on the substrate or to fill out trenches by ALD, PEALD or pulse CVD process. In the latter case, sequential pulse injection of the metal sources are necessary in order to allow regular deposition of the metal in the trench to progressively fill out this trench and ensure that there are no voids in the metallic film, and therefore no defect in the capacitor.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

What is claimed is:

1. A process for depositing a tellurium-containing film on a substrate, comprising:
(a) providing a substrate in a reactor configured for chemical vapor deposition or for atomic layer deposition;
(b) introducing into the reactor at least one tellurium-containing precursor selected from the group consisting of: $Me_2Te=NtBu$; $Me_2Te(-NtBu-)_2TeMe_2$; $Te(NiPr-CiPr—NiPr)_2$; $MeTe(NiPr-CiPr—NiPr)$; $MeTe(NiPr—C(—NMe_2)-NiPr)$; $Te(MeN—CH_2—CH_2—NMe_2)$; $TeMe(MeN—CH_2—CH_2—NMe_2)$; $Te(EtN—CH_2—CH_2—NMe_2)$; $TeMe(EtN—CH_2—CH_2—NMe_2)$; $Te(MeN—CMe_2—CH_2—NMe_2)$; $TeMe(MeN—$ CMe$_2$-CH$_2$—NMe$_2$); Te(MeN—CH$_2$—CH$_2$—OMe); TeMe(MeN—CH$_2$—CH$_2$—OMe); (tBuN=)Te(-NtBu-)$_2$Te(=NtBu); and (iPrN=)Te(-NiPr-)$_2$Te(=NiPr);

(c) optionally, introducing at least one M-containing source, wherein M is Si, Ge, Sb, Sn, Pb, Bi, In, Ag or Se, or a combination of any of those, into said reactor;

(d) optionally, introducing a hydrogen-containing fluid into the reactor;

(e) optionally, introducing an oxygen-containing fluid into the reactor;

(f) optionally, introducing a nitrogen-containing fluid into the reactor;

(g) reacting the precursor(s) and M-containing source(s), if any, in the reactor with the hydrogen-, and/or oxygen- and/or nitrogen-containing fluid(s), if any; and (h) depositing a tellurium-containing film onto the substrate.

2. The process of claim 1, wherein, in (h), said depositing is carried out at a temperature between 200° C. and 600° C.

3. The process of claim 1, wherein, in (h), said depositing is carried out at a pressure between 1 Pa and 100000 Pa.

4. The process of claim 1, wherein at least one said tellurium-containing precursor has a melting point below 100° C.

5. The process of claim 1, wherein at least one said tellurium-containing precursor has a melting point below 50° C.

6. The process of claim 1, wherein at least one said tellurium-containing precursor is liquid at room temperature.

7. The process of claim 1, wherein, in (b), said introducing comprises mixing together at least two of said tellurium-containing precursors to provide a precursor mixture, and introducing said mixture into the reactor.

8. The process of claim 1, wherein, (c) comprises introducing into said reactor at least one germanium source selected from the group consisting of trigermylamine, germane, digermane, and aminogermane compounds of the formula GeR$_x$(NR$^1$R$^2$)$_{4-x}$, wherein x is between 0 and 4, inclusive, and R, R$^1$ and R$^2$ are independently H or a linear, branched or cyclic C$_1$-C$_6$ carbon chain.

9. The process of claim 8, wherein said germanium source is selected from the group consisting of tetrakis(dimethylamino)germane (Ge(NMe$_2$)$_4$), tris(dimethylamino)germane (GeH(NMe$_2$)$_3$), bis(diethylamino)germane (GeH$_2$(NEt$_2$)$_2$) and mixtures of any of those.

10. The process of claim 1, wherein (c) comprises introducing into said reactor at least one antimony source selected from the group consisting of trimethylantimony, dimethylantimony hydride, SbCl$_3$, SbCl$_5$, and amidoantimony compounds of the formula SbR$_x$(NR$^1$R$^2$)$_3$, wherein x is between 0 and 3, inclusive, and R$^1$ and R$^2$ are independently H or a linear, branched or cyclic C$_1$-C$_6$ carbon chain, and mixtures of any of those.

11. The process of claim 1, wherein (c) comprises introducing into said reactor at least one bismuth source selected from the group consisting of BiCl$_3$, Bi(NMe$_2$)$_3$, Bi(NEt$_2$)$_3$, Bi(NEt$_2$)$_3$, and Bi(=NR$^1$)(NR$^2$R$^3$)$_3$, wherein each R$^1$ and R$^2$ are independently H or a linear, branched or cyclic C$_1$-C$_6$ carbon chain, and mixtures of any of those.

12. The process of claim 1, wherein (c) comprises introducing into said reactor at least one tin source selected from the group consisting of stannane, SnCl$_4$ and aminotin compounds having the formula SnR$_x$(NR$^1$R$^2$)$_{4-x}$ wherein x is between 0 and 4, inclusive, and R, R$^1$ and R$^2$ are independently H or a linear, branched or cyclic C$_1$-C$_6$ carbon chain, and mixtures of any of those.

13. The process of claim 12, wherein one said tin source is selected from the group consisting of tetrakis(dimethylamino)tin (Sn(NMe$_2$)$_4$), tris(dimethylamino)tin (SnH(NMe$_2$)$_3$) and mixtures thereof.

14. The process of claim 1, wherein (c) comprises introducing into said reactor at least one silicon source selected from the group consisting of trisilylamine, silane, disilane, trisilane, aminosilanes of the formula SiR$_x$(NR$^1$R$^2$)$_{4-x}$ wherein x is between 0 and 4, inclusive, and R, R$^1$ and R$^2$ are independently H or a linear, branched or cyclic C$_1$-C$_6$ carbon chain.

15. The process of claim 14, wherein one said silicon source is selected from the group consisting of tetrakis(dimethylamino)silane (Si(NMe$_2$)$_4$), tris(dimethylamino)silane (SiH(NMe$_2$)$_3$), bis(diethylamino)silane (SiH$_2$(NEt$_2$)$_2$) and mixtures of any of those.

16. The process of claim 1, wherein, in (d), said hydrogen-containing fluid is selected from the group consisting of H$_2$, NH$_3$, hydrazine and its alkyl or aryl derivatives, H$^+$, NH$^+$, and NH$_2^+$ radicals, and mixtures of any of those.

17. The process of claim 1, wherein in (f), said nitrogen-containing fluid is selected from the group consisting of N$_2$, NH$_3$, hydrazine and its alkyl or aryl derivatives, N$^+$, NH$^+$ and NH$_2^+$ radicals, and mixtures of any of those.

18. The process of claim 1, wherein (h) comprises depositing said tellurium-containing film onto the substrate at a temperature between 350° C. and 550° C.

19. The process of claim 1, wherein said introducing comprises performing (b) and (c)-(f), simultaneously, and said reactor is configured for chemical vapor deposition.

20. The process of claim 1, wherein said introducing comprises performing (b) and (c)-(f), sequentially, and said reactor is configured for atomic layer deposition.

21. The process of claim 1, wherein (b) and (c) are performed together in one pulse and (d) is performed in a separate pulse, for modified atomic layer deposition.

22. The process of claim 1, wherein, in (d), hydrogen gas is continuously introduced and (b) and (c) comprise introducing said tellurium or M-containing source by pulsing, for pulsed chemical vapor deposition.

* * * * *

UNITED STATES PATENT AND TRADEMARK OFFICE
CERTIFICATE OF CORRECTION

PATENT NO. : 8,454,928 B2
APPLICATION NO. : 12/212350
DATED : June 4, 2013
INVENTOR(S) : Christian Dussarrat Page 1 of 1

It is certified that error appears in the above-identified patent and that said Letters Patent is hereby corrected as shown below:

In the Claims:

Claim 2, Column 9, Line 20, Change "200° C." to --200° C--

Claim 10, Column 9, Line 49, Change "$SbR_x(NR^1R^2)_3$" to --$SbR_x(NR^1R^2)_{3-x}$--

Claim 18, Column 10, Line 40, Change "350° C." to --350° C--

Signed and Sealed this
Fifteenth Day of October, 2013

Teresa Stanek Rea
*Deputy Director of the United States Patent and Trademark Office*